United States Patent
Kasahara (10) Patent No.: US 11,460,930 B2
(45) Date of Patent: Oct. 4, 2022

(54) KEYBOARD WITH NAVIGATIONAL CONTROL FUNCTIONS

(71) Applicant: PFU AMERICA, INC., Sunnyvale, CA (US)

(72) Inventor: Yuki Kasahara, San Jose, CA (US)

(73) Assignee: PFU America, Inc., Sunnyvale, CA (US)

( * ) Notice: Subject to any disclaimer, the term of this patent is extended or adjusted under 35 U.S.C. 154(b) by 0 days.

(21) Appl. No.: 17/301,366

(22) Filed: Mar. 31, 2021

(65) Prior Publication Data
US 2021/0342015 A1 Nov. 4, 2021

Related U.S. Application Data

(60) Provisional application No. 63/019,809, filed on May 4, 2020.

(51) Int. Cl.
*G06F 3/044* (2006.01)
*G06F 3/02* (2006.01)
(Continued)

(52) U.S. Cl.
CPC .......... *G06F 3/0219* (2013.01); *G06F 3/0227* (2013.01); *G06F 3/0383* (2013.01);
(Continued)

(58) Field of Classification Search
CPC .... G06F 3/0219; G06F 3/0227; G06F 3/0383; G06F 3/044; G06F 3/04883; G06F 2203/04104; G06F 2203/0381
See application file for complete search history.

(56) References Cited

U.S. PATENT DOCUMENTS

| | | | |
|---|---|---|---|
| 2010/0148995 A1* | 6/2010 | Elias | G06F 3/0488 178/18.03 |
| 2013/0169534 A1* | 7/2013 | Jiang | G06F 3/0213 345/158 |

(Continued)

FOREIGN PATENT DOCUMENTS

| | | |
|---|---|---|
| EP | 2607998 A1 | 6/2013 |
| KR | 101631069 B1 | 6/2016 |
| WO | 2015047412 A1 | 4/2015 |

OTHER PUBLICATIONS

Extended European Search Report (EESR) and Rule 62 EPC transmittal letter, dated Oct. 7, 2021, mailed in connection with EP Application 21169668.7, a counterpart foreign application, 9 pages total.

*Primary Examiner* — Carolyn R Edwards
(74) *Attorney, Agent, or Firm* — Fujitsu Patent Center (57) ABSTRACT

A system for navigating a host device, including a host device, a display serving as a graphical user interface (GUI), and a keyboard with navigational control functions is disclosed. The keyboard comprises at least a frame, a plurality of keys, one or more key-top touch sensors, one or more edge touch sensors, and a keyboard communication interface. The keyboard is an all-in-one input device capable of operatively receiving text inputs, mouse cursor inputs, and gesture inputs from a user, sending them to the host device, and controlling a GUI of the host device. Advantageously, the keyboard may replace a conventional keyboard and mouse without sacrificing the individual functionality of either apparatus.

20 Claims, 8 Drawing Sheets

(51) Int. Cl.
*G06F 3/038* (2013.01)
*G06F 3/04883* (2022.01)

(52) U.S. Cl.
CPC .......... *G06F 3/044* (2013.01); *G06F 3/04883* (2013.01); *G06F 2203/0381* (2013.01); *G06F 2203/04104* (2013.01)

(56) References Cited

U.S. PATENT DOCUMENTS

| | | | | |
|---|---|---|---|---|
| 2014/0078063 | A1* | 3/2014 | Bathiche | G06F 3/0235 |
| | | | | 345/168 |
| 2014/0176435 | A1* | 6/2014 | Jiang | G06F 3/0213 |
| | | | | 345/158 |
| 2014/0262721 | A1* | 9/2014 | Yu | H03K 17/9622 |
| | | | | 200/600 |
| 2014/0267055 | A1* | 9/2014 | Burrell | G06F 1/1692 |
| | | | | 345/169 |
| 2015/0091858 | A1* | 4/2015 | Rosenberg | G06F 3/04144 |
| | | | | 345/174 |
| 2015/0169218 | A1* | 6/2015 | Cromer | G06F 3/04886 |
| | | | | 715/773 |
| 2015/0324116 | A1 | 11/2015 | Marsden et al. | |
| 2015/0338886 | A1* | 11/2015 | Seo | G06F 1/1669 |
| | | | | 361/679.09 |
| 2018/0203521 | A1* | 7/2018 | Wackers | G06F 3/0202 |
| 2019/0033923 | A1* | 1/2019 | Wang | G06F 1/1637 |
| 2019/0361543 | A1 | 11/2019 | Zhang | |

\* cited by examiner

KEYBOARD WITH NAVIGATIONAL CONTROL FUNCTIONS

CROSS-REFERENCE TO RELATED APPLICATION

This application is based upon and claims the benefit of and priority to U.S. Provisional Application No. 63/019,809 filed on May 4, 2020, which is herein incorporated by reference in its entirety.

FIELD

The present disclosure generally relates to input devices for computers and, more specifically, to navigational input devices for computers.

BACKGROUND

A keyboard is an input device commonly used in conjunction with a personal computer, tablet, gaming console, or related computing device to enable text inputs from a user. Typically, keyboards feature an arrangement of keys or buttons, where the actuation of a particular key or combination of keys corresponds to the input of an alphanumeric character into the computer.

In the past, many computers employed Character User Interfaces (CUI), interfaces which receive and present information in alphanumeric format only. A conventional keyboard with text input capabilities may thus suffice as the only input device necessary to operate these computers. However, many newer computing devices now employ Graphical User Interfaces (GUI), interfaces which visually represent the interaction between a user and the device. The GUI may be displayed on a monitor and feature virtual icons, windows, menus, pointers, and the like. For these computing devices, additional input devices with navigational control functions may be beneficial or even necessary to enable user control. For example, a mouse, pointing stick, or joystick may enable a two-dimensional navigational input, also known as a mouse cursor input, which controls a virtual pointer within the GUI. Likewise, a trackpad or touchpad may enable the same features, but may further recognize and map specific patterns of navigational inputs to preprogrammed functions, otherwise known as gesture inputs. Accordingly, many modern computing devices utilize both a keyboard and either a mouse or a trackpad as complementary input devices.

Because the keyboard and mouse are traditionally distinct apparatus, a user may need to frequently switch from one device to the other while operating the computer, thereby suffering an interruption in the process. The switch may be physically disruptive, particularly if the input devices are physically far apart, and it may also be mentally disruptive. For example, a user may need to relocate their fingers on the correct keys each time their hands leave the keyboard, potentially breaking the user's train of thought. Some prior art designs have attempted to address this inefficiency by combining a conventional keyboard and a conventional trackpad into a single input device. Unfortunately, the designs of the prior art may also impair the individual functionality of either or both devices.

One such example of prior art is found in the 2-in-1 Touchpad Fusion Keyboard, designed and sold by Innopresso, Inc. This product features a QWERTY keyboard and a plurality of touch sensors underpinning its keys, such that the entire keyboard surface acts as a single trackpad. However, in order to enable both keyboard and trackpad functionality, the Fusion Keyboard may impair the ergonomics of both input modes. In particular, the Fusion Keyboard features a narrow key pitch (the distance between adjacent keys), which may hinder a user's ability to distinguish between these keys, thereby reducing typing accuracy and overall comfort. The Fusion Keyboard also foregoes key dish (the slight concave shape to each individual key), a mechanism designed to help guide and maintain a user's fingers on the correct keys. It may be inferred that the key pitch is designed narrow and the key dish eliminated to facilitate the trackpad aspect of the Fusion Keyboard, i.e. to better approximate the surface flatness of a conventional trackpad. Even so, the presence of key pitches of any size creates irregularities in the trackpad surface, which may reduce the efficacy of the Fusion Keyboard for mouse cursor inputs and gesture inputs as well.

SUMMARY

There remains a need in the art for an input device enabling both keyboard functions and navigational control functions without sacrificing the efficiency, accuracy, or comfort of either device individually.

According to an aspect of the present disclosure, a keyboard with navigational control functions is disclosed. The keyboard comprises a frame; a plurality of keys supported by the frame; one or more key-top touch sensors, each sensor located on a surface of one of the plurality of keys; one or more edge touch sensors, each sensor located on an edge of the frame; and a communication interface to output one or more navigational control signals received from the one or more key-top touch sensors and the one or more edge touch sensors.

The object and advantages of the embodiments will be realized and achieved at least by the elements, features, and combinations particularly pointed out in the claims. Both the foregoing general description and the following detailed description are given as examples and are explanatory and are not restrictive of the invention, as claimed.

BRIEF DESCRIPTION OF THE DRAWINGS

Example embodiments will be described and explained with additional specificity and detail through the use of the accompanying drawings in which.

DETAILED DESCRIPTION

Figure 1:
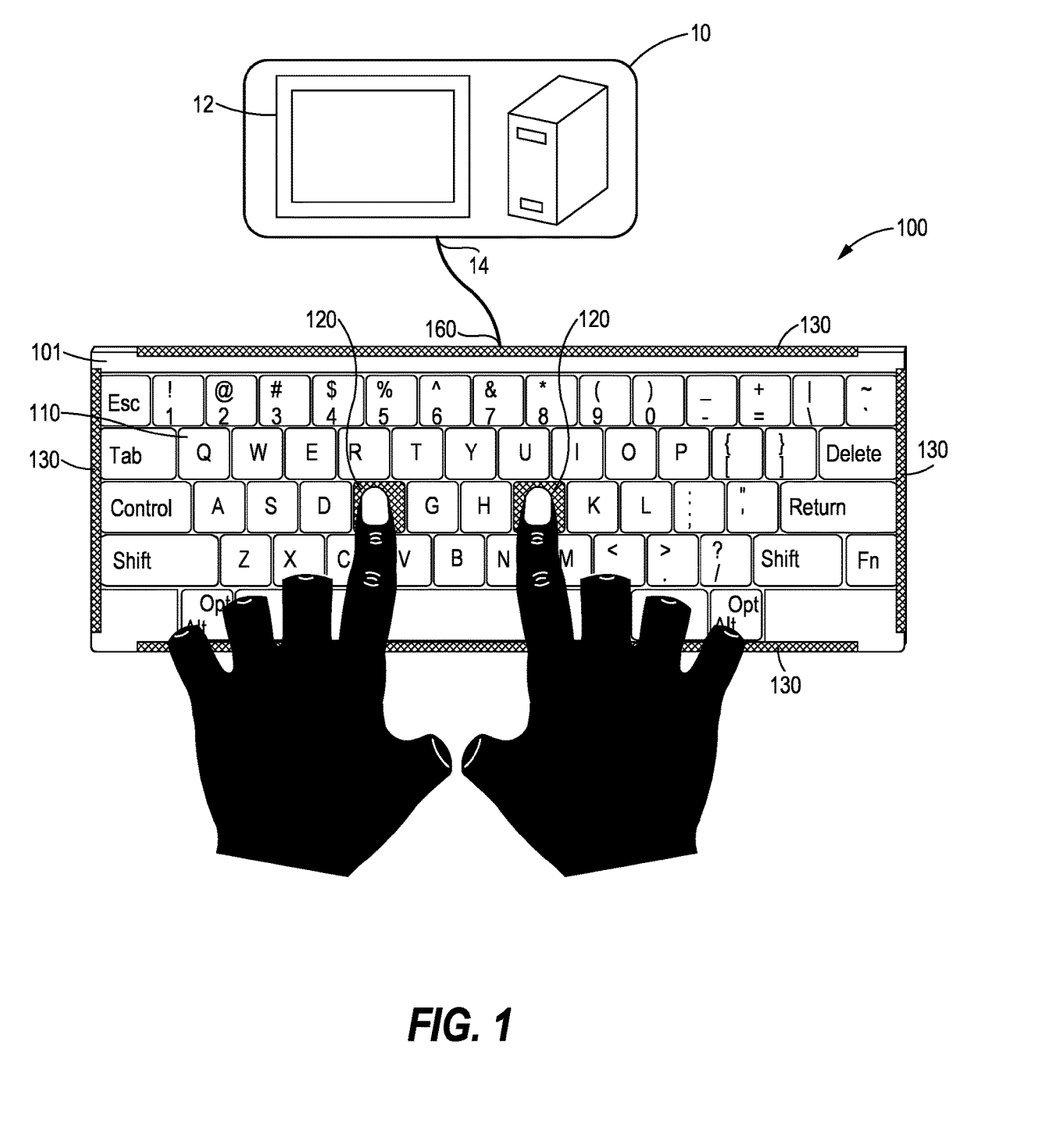
FIG. 1 illustrates a system for navigating a host device, including a host device and a keyboard with navigational control functions, according to an embodiment of the present disclosure.

Referring now to the drawings and with specific reference to FIG. 1, a system for navigating a host device is generally referred to by a reference numeral 1. The system 1 comprises a host device 10 including a display 12 and a host communication interface 14; and a keyboard with navigational control functions 100. The keyboard 100 may comprise at least a frame 101; a plurality of keys 110 supported by the frame 101; one or more key-top touch sensors 120, each sensor 120 located on a surface of one of the plurality of keys 110; one or more edge touch sensors 130, each located on an edge of the frame 101; and a keyboard communication interface 160. The keyboard 100 may operate both as a conventional keyboard and as a navigational input device, i.e. a mouse or trackpad. Accordingly, it may enter text inputs, mouse cursor inputs, and gesture inputs into the host device 10.

Figure 2:
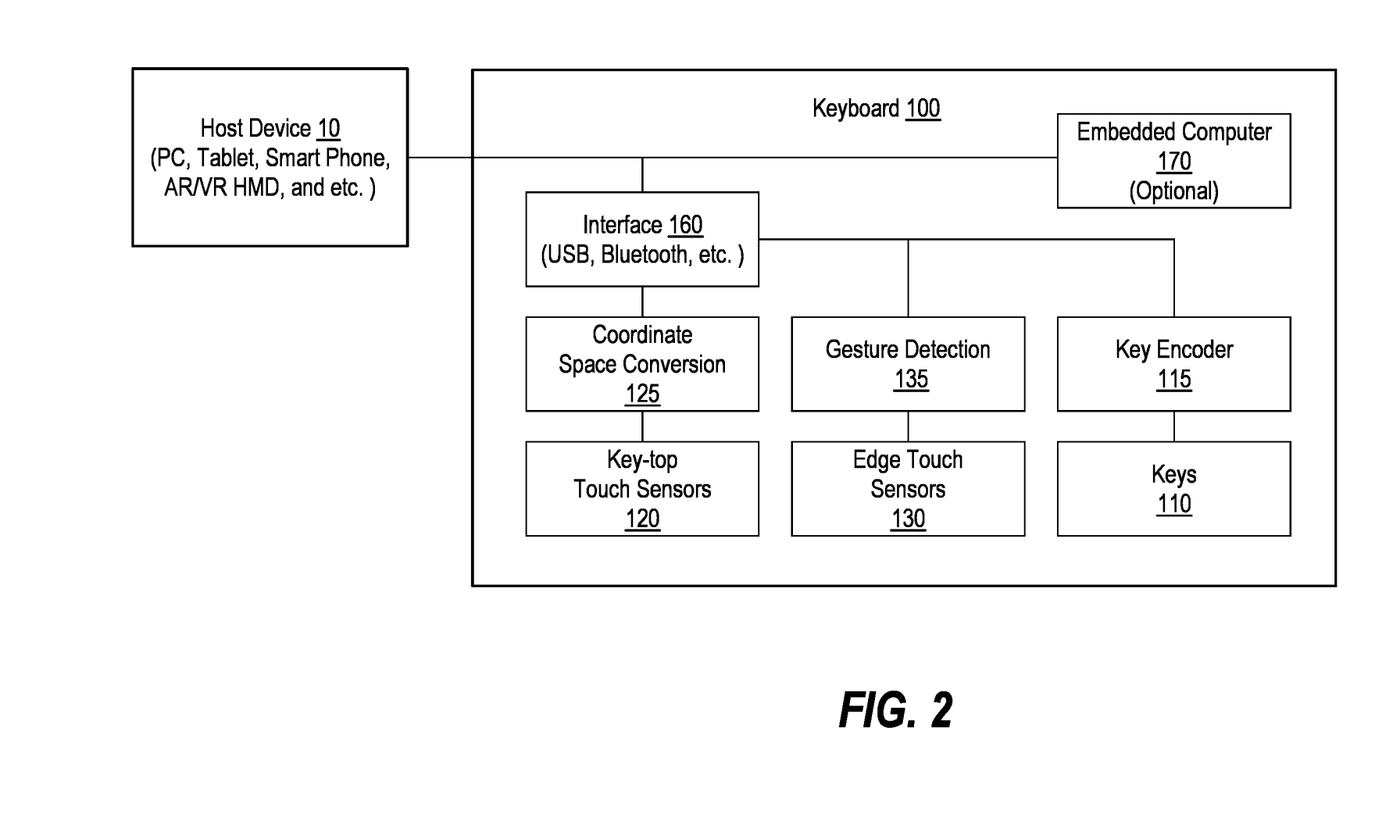
FIG. 2 illustrates a high-level schematic diagram of a system for navigating a host device, including a host device and a keyboard with navigational control functions, according to another embodiment of the present disclosure.

Turning now to FIG. 2, a high-level schematic diagram of the keyboard 100 is shown. The keyboard 100 includes three input mechanisms through which a user may enter an action: the plurality of keys 110, the key-top touch sensors 120, and the edge touch sensors 130. In addition, each input mechanism may have supporting hardware and software in the back-end of the device, which converts the user action into its respective input type. The first input mechanism, the plurality of keys 110, may manifest as mechanically actuatable levers, electronic switches, capacitive keys, or any other key design in the art capable of detecting a keypress. On the back-end, a key encoder module 115 may operatively convert the keypress into a text input for the host device 10. The second input mechanism, the key-top touch sensors 120, may manifest as capacitive pads, touch sensors, or any other sensor in the art capable of detecting a coordinate and/or motion of a touch. On the back-end, a coordinate space conversion module 125 may operatively convert the touch into a mouse cursor input or a gesture input for the host device 10. The third input mechanism, the edge touch sensors 130, may manifest as capacitive pads, touch sliders, or any other sensor in the art capable of detecting a coordinate and/or motion of a touch. Likewise, on the backend, a gesture detection module 135 may operatively convert the touch into a gesture input for the host device 10.

In some embodiments of the present disclosure, the keyboard 100 acts as a peripheral device that is distinct from the host device 10. For example, the host device 10 may be a personal computer, tablet, augmented reality (AR) or virtual reality (VR) head-mounted display, gaming console, or comparable computing device which does not include its own keyboard. In such cases, the keyboard communication interface 160 enables a wired or wireless connection with the host 10, through which outputs from the key encoder 115, coordinate space conversion module 125, and gesture detection module 135 are transmitted. The communication interface 160 may be a Universal Serial Bus (USB), a radio frequency (RF) channel such as Wi-Fi or Bluetooth, an infrared (IR) channel, or another communication protocol known in the art, where no limitation is intended herein. In other embodiments of the present disclosure, the keyboard 100 may itself serve as the host device 10. For example, the keyboard 100 may be a smartphone, mobile computer, or the like. In such cases, the keyboard 100 may further include an embedded computer 170 configured to receive and process operating instructions based on input from the keyboard.

Figure 3:
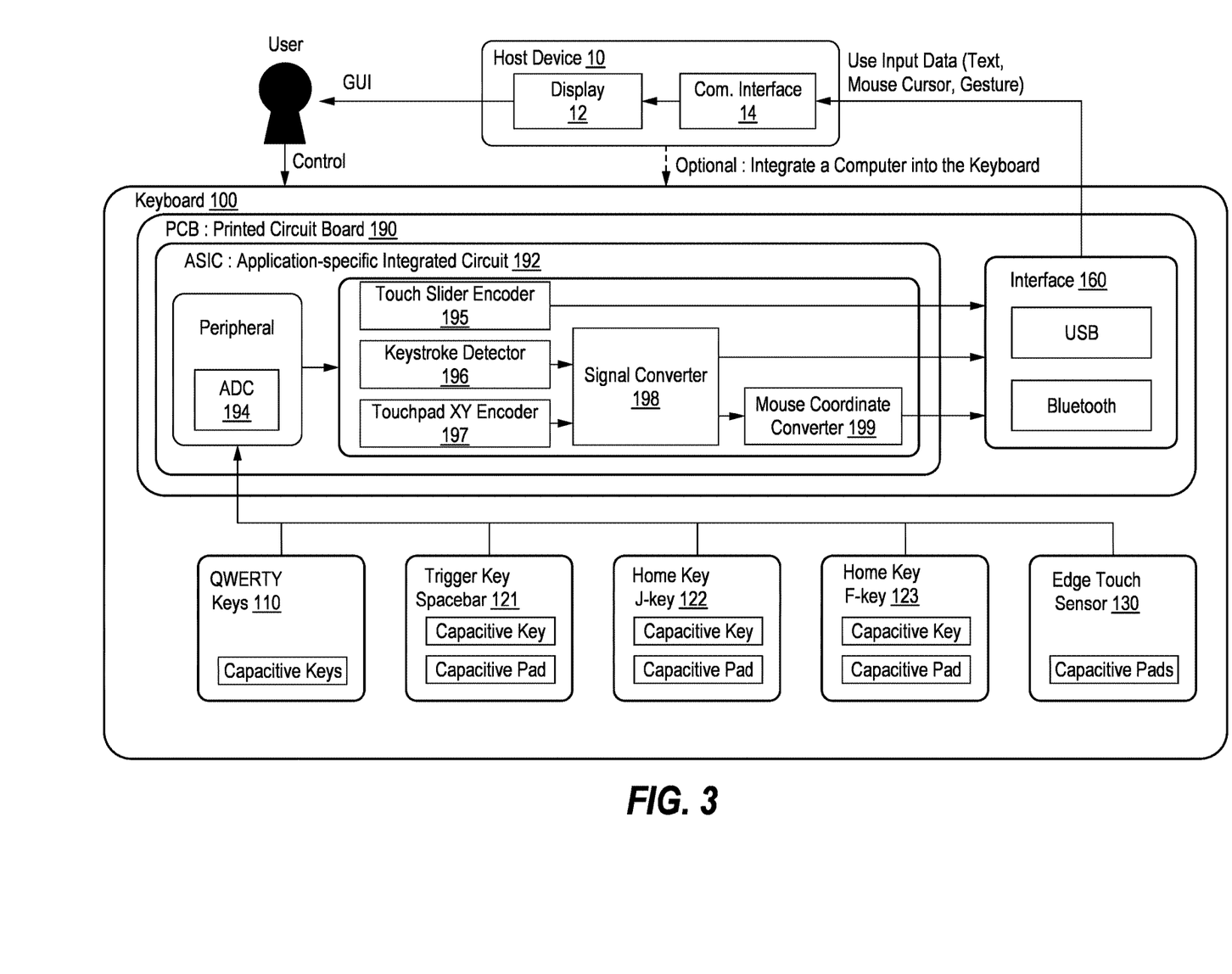
FIG. 3 illustrates a detailed schematic diagram of a system for navigating host device, including a host device and a keyboard with navigational control functions, according to yet another embodiment of the present disclosure.

Turning now to FIG. 3, a detailed schematic diagram of system 1 is shown. Where FIG. 2 introduced a high-level overview of the three input mechanisms and their respective back-end modules, FIG. 3 breaks down the specific components functionally enabling each input mechanism and module.

The first input mechanism, the plurality of keys 110, may be capacitive keys arranged in a conventional QWERTY layout on the frame 101, although other key layouts are also possible and envisioned. The second input mechanism, the key-top touch sensors 120, may be capacitive pads located on a trigger key 121 and on one or more home keys 122, 123, chosen from among the plurality of keys 110. Functionally, the home keys 122, 123 may be used to receive the navigational inputs, while the trigger key 121 may be used to switch between operating modes of the keyboard. In an embodiment, the spacebar is designated as the trigger key 121 and the F-key and J-key are designated as the home keys 122 and 123, respectively. In other embodiments, other keys 110 or combinations of keys 110 may instead be selected to be the trigger 121 or home 122, 123. Lastly, the edge touch sensors 130 may be capacitive pads located on one or more edges of the frame 101. In the embodiment shown in FIG. 1, there may be an edge sensor 130 placed on each of the top, bottom, left, and right borders of the keyboard 100. In other embodiments, however, there may be a different number or arrangement of edge sensors 130, where no limitation is intended herein so long as their placement does not interfere with the performance of the plurality of keys 110 or the key-top touch sensors 120.

Returning now to FIG. 3, the keyboard 100 may further comprise a printed circuit board (PCB) 190 and one or more electronic circuits, such as one or more integrated circuits (ICs), or more particularly one or more application-specific integrated circuits (ASICs) 192 implemented on the PCB 190. The keyboard communication interface 160 may also be implemented on the PCB 190, or it may be implemented on another circuit board of the keyboard 100. In either case, the ASIC 192 receives analog signals from the three input mechanisms, processes these signals, and transmits them to the interface 160 for subsequent communication to the host device 10.

To process the analog signals, the ASIC 192 first implements an analog-to-digital converter (ADC) 194. The ADC 194 may convert an analog keypress signal from the plurality of keys 110 into a digital keypress signal; an analog key-top touch signal from the key-top touch sensors 120 into a digital key-top touch signal; and/or an analog edge touch signal from the edge touch sensors 130 into a digital edge touch signal. In some embodiments, the digital signals may be sent directly to the communication interface 160 following conversion by the ADC 194. In other embodiments, the digital signals are further processed through additional modules of the ASIC 192, which convert the signals into the appropriate text input, mouse cursor input, or gesture input formats. These additional modules include the touch slider encoder 195, the keystroke detector 196, the touchpad XY encoder 197, the signal converter 198, and the mouse coordinate converter 199, each of which will be discussed in detail below.

The touch slider encoder 195 operatively converts the digital edge touch signal from the ADC 194 into a gesture input through any combination of hardware, firmware, or software means known in the art. In particular, the touch slider encoder 195 may consider, among other possible factors, the position of a touch on the edge touch sensor 130 and/or the motion of a touch on the edge touch sensor 130 as a function of time. The touch slider encoder 195 may be capable of interpreting any number of gestures common to the art, including without limitation: horizontal scrolling, vertical scrolling, scaling up, scaling down, panning, and task switching. Following conversion, the gesture input is sent to the interface 160 and communicated to the host device 10.

The keystroke detector 196 receives a digital keypress signal from the ADC 194 and determines if the digital keypress signal registers as an intended keystroke by the user (as opposed to say, a false activation). Where the plurality of keys 110 are capacitive keys, the keystroke detector 196 may measure the resulting capacitance change in the digital keypress signal and compare it to a predetermined capacitance threshold. If the threshold is exceeded, the keystroke detector 196 registers the signal as a keystroke, but not otherwise. Where the keyboard 100 employs mechanical keys or electrical switches in lieu of capacitive keys, the keystroke detector 196 may instead qualify the digital keypress signal through an analogous mechanical or electrical threshold. After registering the keystroke, the keystroke detector 196 may transmit a keystroke signal and a keycode to the signal converter 198, where the keystroke signal identifies the presence of the keystroke and the keycode identifies the particular key 110 being pressed.

The touchpad XY encoder 197 operatively converts the digital key-top touch signal from the ADC 194 into navigational information through any combination of hardware, firmware, or software means known in the art. The navigational information may describe, for example, the XY-coordinates of the touch as a function of time. Subsequently, the touchpad XY encoder 197 sends the navigational information to the signal converter 198 for further processing.

The signal converter 198 receives the keystroke signal and the keycode from the keystroke detector 196, receives the navigational information from the touchpad XY encoder 197, and determines which input (text, mouse cursor, or gesture) is intended by the user. It should be understood that, because the key-top touch sensors 120 are located on the plurality of keys 110, a user may touch a key-top touch sensor 120 when typing, i.e. intending to enter a text input. In this scenario, the signal converter 198 may receive both navigational information and keystroke signals, and must determine if the user is intending to enter a text input, a mouse cursor input, or a gesture input. In another scenario, the user may touch the key-top touch sensor 120 to move the mouse or to enter a gesture. Accordingly, the signal convert 198 must determine if the user is intending to enter a mouse cursor input or a gesture input. The intended input type may be determined according to a number of factors, including but not limited to the specific combination of keystrokes, the duration between multiple keystrokes, the characteristics of the navigational input, etc. A more detailed description of these criteria may be found in the Practical Application section of this disclosure.

If the signal converter 198 determines that a text input is intended, it may convert the keystroke signal and the keycode from the keystroke detector 196 into the text input through any combination of hardware, firmware, or software means known in the art. In some embodiments, the text input may simply be the keystroke signal and the keycode, where no further encoding is necessary. The text input is then sent to the interface 160 and communicated to the host device 10.

If the signal converter 198 determines that a gesture input is intended, it may convert the digital key-top touch signal into the gesture input through any combination of hardware, firmware, or software means known in the art. In particular, the signal converter 198 may consider, among other possible factors, the key-top touch sensor(s) 120 being touched and/or the motion(s) of the touch on the key-top touch sensor(s) 120 as a function of time. The signal converter 198 may be capable of interpreting any number of gestures common to the art, including without limitation: horizontal scrolling, vertical scrolling, scaling up, scaling down, panning, and task switching. After conversion, the gesture input is sent to the interface 160 and communicated to the host device 10.

If the signal converter 198 determines that a mouse cursor input is intended, it may transmit the navigational information from the touchpad XY encoder 197 to a mouse coordinate converter 199. In turn, the mouse coordinate converter 199 converts the navigational information into the mouse cursor input through any combination of hardware, firmware, or software means known in the art. In particular, the mouse coordinate converter 199 may perform coordinate conversion on the navigational information through one of the two methods shown in FIGS. 4 and 5. Although FIG. 3 illustrates that an ASIC 192 is deployed on the PCB 190 to implement the various modules 194-199, it is should be understood that one more ASICs or ICs other than ASICs may be used to implement these various modules and their functions.

Figure 4:
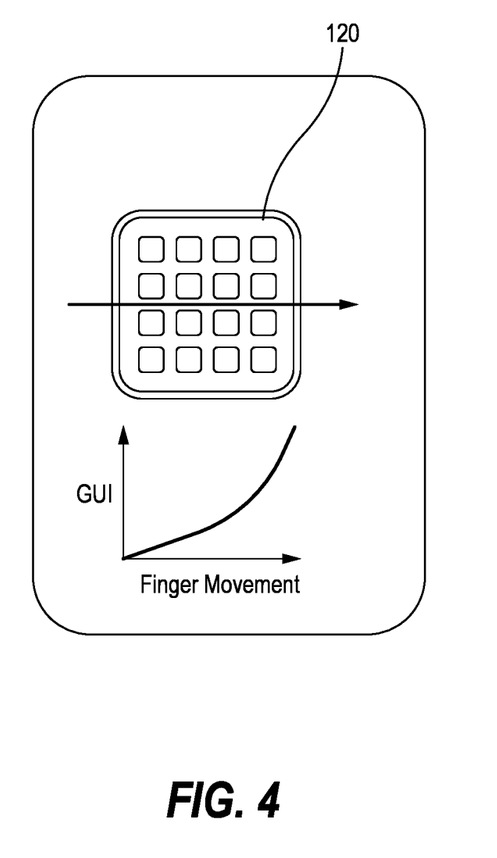
FIG. 4 illustrates a graph representing a mouse coordinate conversion function according to the present disclosure, and specifically an exponential output function.
Figure 5:
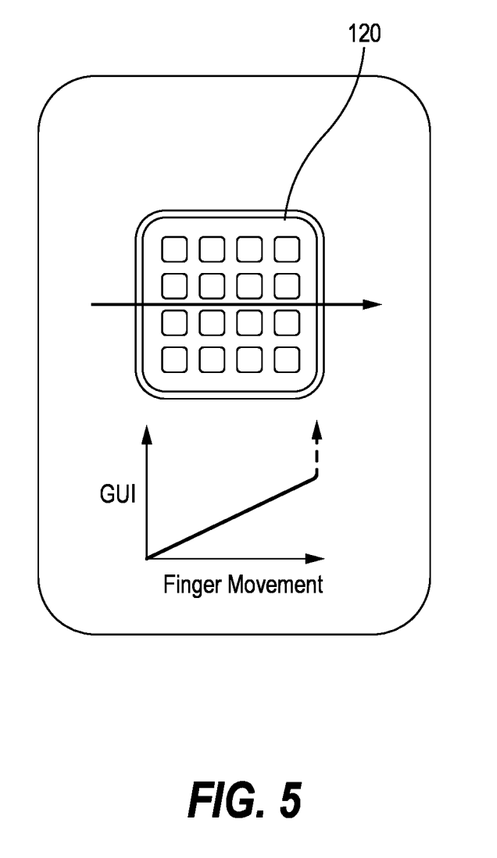
FIG. 5 illustrates a graph representing a mouse coordinate conversion function according to the present disclosure, and specifically a continuous output function.

As seen in FIG. 4, the navigational information may be converted through exponential output. In this method, a linear finger movement on a key-top touch sensor 120 is mapped to an exponential movement of the mouse cursor. Because each key-top touch sensor 120 is limited in size to the surface area of the key 110, exponential output allows a user to quickly navigate a greater area of the display 12. In an alternative method seen in FIG. 5, the navigational information may be converted through continuous output on edge. In this method, a finger movement ending and remaining on an edge of a key-top touch sensor 120 will cause the mouse cursor to move with its preceding momentum. In different embodiments, the mouse cursor may maintain its prior speed or may move at a set speed; and/or the mouse cursor may maintain its prior trajectory or may move in a direction based on the last touch position. Similar to exponential output, continuous output on edge allows a user to quickly navigate a greater distance of the display 12, irrespective of the surface area of the key-top touch sensor 120. After conversion, the mouse coordinate converter 199 sends the mouse cursor input to the interface 160, where it is communicated to the host device 10.

With continued reference to FIG. 3, the interface 160 communicates the text input, mouse cursor input, or gesture input to the host device 10, and specifically to a host communication interface 14. Subsequently, the host device 10 interprets the input and behaves accordingly, outputting changes to a GUI through the display 12. The user, upon reading the changes to the GUI, may continue to enter new inputs and thereby repeat the cycle. Where the keyboard 100 is itself the host device 10, i.e. has the embedded computer 170, the communications between the interface 160 and the interface 14 may be foregone, or may simply be performed internally. What follows are three examples of a complete pipeline for each of the three input mechanisms, from a user action on the keyboard 100 to reception by the host 10.

According to the first input mechanism, a user may type using the plurality of keys 110. The resulting analog keypress signal from each key 110 may be sent to the ADC 194 and converted into a digital keypress signal. Next, the digital keypress signal may be sent to the keystroke detector 196 and converted into a keystroke signal and a keycode. The keystroke signal and the keycode may be sent to the signal converter 198, where it is determined that a text input is indeed intended by the user. The signal converter 198 may then send the keystroke signal and the keycode to the interface 160 as a text input, where additional encoding may or may not be required. Following, the interface 160 sends the text input to the host device 10.

According to a second input mechanism, a user may enter a gesture using an edge touch sensor 130. The gesture may be, for example, a left-to-right swiping motion. The resulting analog edge touch signal from the edge touch sensor 130 may be sent to the ADC 194 and converted into a digital edge touch signal. Next, the digital edge touch signal may be sent to the touch slider encoder 195 and converted into a gesture input. The touch slider encoder 195 may then send the gesture input to the interface 160, where it is subsequently communicated to the host device 10.

According to a third input mechanism, a user may also enter a gesture using a key-top touch sensor 120. The gesture may be, for example, two simultaneous, left-to-right swiping motions on the key-top touch sensors 120 of the two home keys 122, 123. The resulting analog key-top touch signals may be sent to the ADC 194 and converted into digital key-top touch signals. Next, the digital key-top touch signals may be sent to the touchpad XY encoder 197 and converted into navigational inputs. The navigational inputs are transmitted to the signal converter 198, where it is determined that a gesture input is indeed intended by the user. The signal converter 198 may then convert the navigational inputs into the corresponding gesture input and send the gesture input to the interface 160. Following, the interface 160 communicates the gesture input to the host device 10.

Alternatively, according to the third input mechanism, a user may also move a cursor using a key-top touch sensor 120. The resulting analog key-top touch signal may be sent to the ADC 194 and converted into a digital key-top touch signal. Next, the digital key-top touch signal may be sent to the touchpad XY encoder 197 and converted into a navigational input. The navigational input is transmitted to the signal converter 198, where it is determined that a mouse cursor input is indeed intended by the user. Following, the navigational input is sent to the mouse coordinate converter 199 and converted into the mouse cursor input through one of two coordinate conversion methods, exponential output or continuous output on edge. The coordinate converter 199 may then send the mouse cursor input to the interface 160, where it is subsequently communicated to the host device 10.

By following the designs disclosed herein, a keyboard 100 may be implemented with navigational control functions, thereby enabling a user of the keyboard 100 to easily and accurately enter a text input, a mouse cursor input, or a gesture input to a host device 10.

Practical Application

The present application may find industrial applicability in any number of computing devices having graphical user interfaces, including without limitation: personal computers, tablets, smartphones, VR or AR head-mounted displays, video game consoles, in-car computers, etc. In particular, the keyboard 100 may be applied to any host device 10 that may utilize text inputs, mouse cursor inputs, or gesture inputs, and may be most useful to those host devices 10 which utilize all three. By employing the designs disclosed herein, both typing functionality and all-in-one GUI control functionality may be enabled through a single device, obviating the need for a separate keyboard and mouse, trackpad, or touchpad. This may reduce the number of external components connected to a host device 10, potentially freeing up ports of the host device 10, reducing power usage, and clearing up space for the user.

Furthermore, the keyboard 100 of the present disclosure may enable a more ergonomic and efficient user experience when compared to a conventional keyboard and mouse. By using the keyboard 100, a user may avoid switching between input devices as they type and/or navigate a GUI, saving time and reducing interruptions. The keyboard 100 effectively combines text and navigational inputs without sacrificing the accuracy or comfort of either operation. As a device for text input, the plurality of keys 110 (and their arrangement) may be unchanged from that of a conventional keyboard. As a device for mouse cursor input, the key-top touch sensors 120, through coordinate conversion, may efficiently navigate a GUI. As a device for gesture input, multiple input mechanisms in the form of the key-top touch sensors 120 and the edge touch sensors 130 allow for a variety of possible gestures. Moreover, the fact that a particular gesture may be entered through either the key-top touch sensors 120 or the edge touch sensors 130 creates more freedom and customizability for the user.

Figure 6:
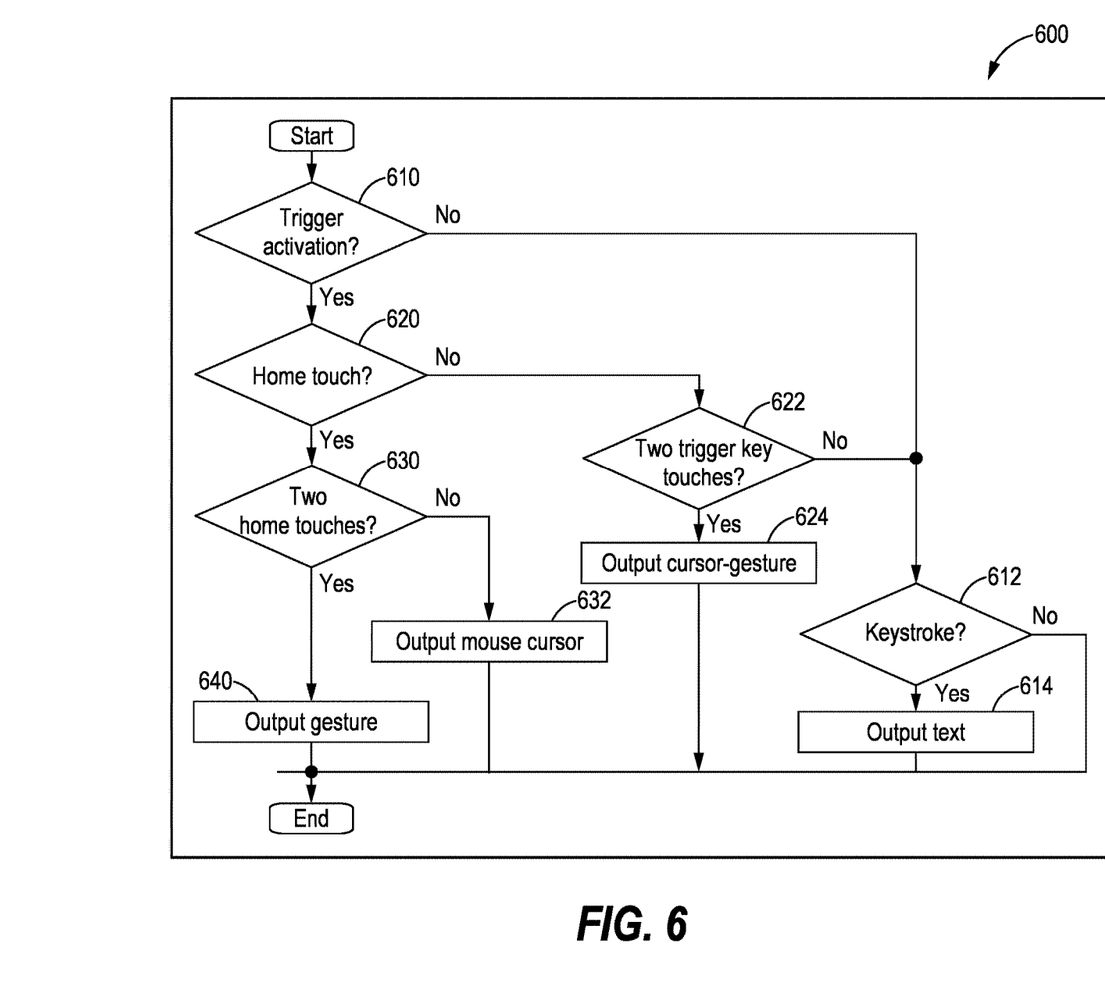
FIG. 6 illustrates a flowchart depicting a method of operating a keyboard with navigational control functions according to an embodiment of the present disclosure.

Turning now to FIGS. 6-12, a method 600 of operating a keyboard with navigational control functions 100 is shown. Specifically, FIG. 6 is a flowchart outlining the steps of the method 600 while FIGS. 7-12 illustrate exemplary user actions corresponding to each step. The method comprises at least: detecting a trigger activation from a key-top touch sensor 120 located on a trigger key 121; and entering an operating mode of the keyboard 100 based on the trigger activation.

Figure 7:
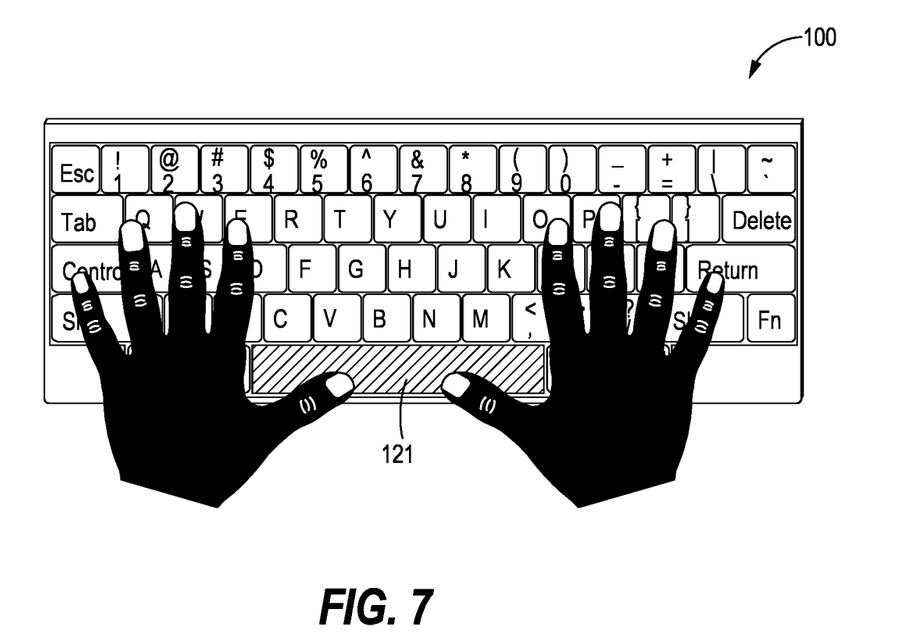
FIG. 7 illustrates an illustration of a user action corresponding to a step of the method shown in FIG. 6, and specifically a step of detecting a trigger.

With reference to FIGS. 6 and 7, the method may begin by detecting a trigger activation from a key-top touch sensor 120 on a trigger key 121 (block 610). In an embodiment, the trigger key 121 may be the spacebar on a conventional QWERTY keyboard, and the trigger activation may be a quick touch of the corresponding sensor 120 without an accompanying keystroke. In other embodiments, the trigger activation may be more involved, such as a touch with a minimum duration, where additional criteria may be decided by specific applicational requirements.

Figure 8:
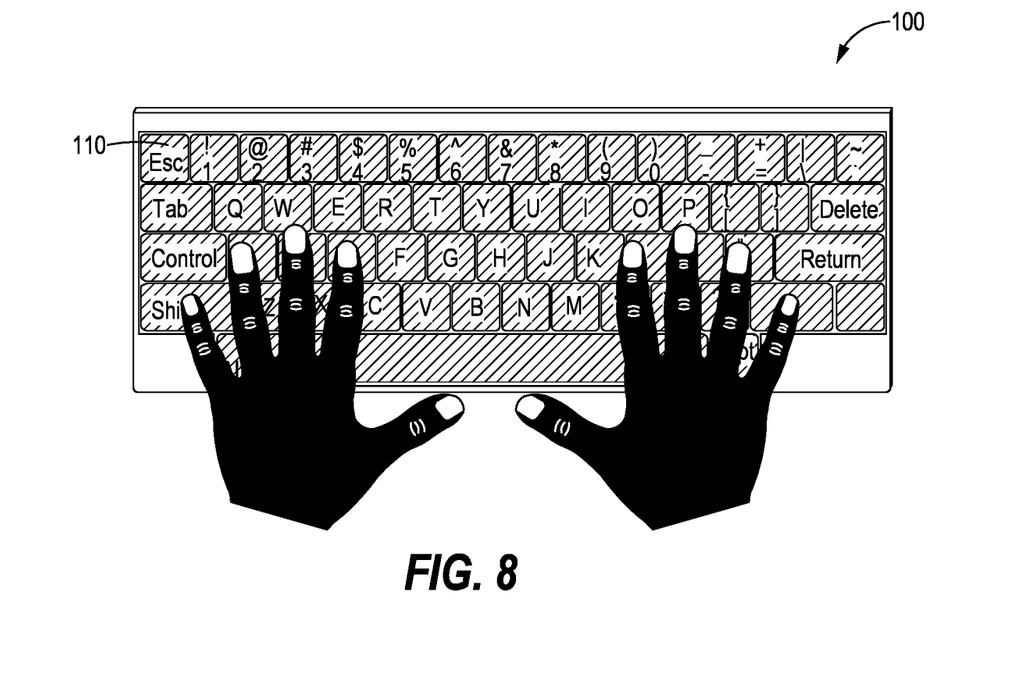
FIG. 8 illustrates an illustration of a user action corresponding to a step of the method shown in FIG. 6, and specifically where the keyboard is in a text input operating mode.

With reference to FIGS. 6 and 8, if there is no trigger activation, the keyboard 100 may continue to block 612 and detect for the presence of a keystroke. If a keystroke is detected, the keyboard 100 may enter a text input mode for receiving a text input (block 614). Accordingly, the keyboard 100 may only use signals from the plurality of keys 110 and communicate the corresponding text input to the host device 10. In other words, if there is no trigger activation but keystrokes are detected, the keyboard 100 behaves as a conventional keyboard in the art. Accordingly, as seen in FIG. 8, a user may type using any of the plurality of keys 110. Following the completion of block 614, the keyboard 100 may return to block 610 and restart the method 600.

Figure 9:
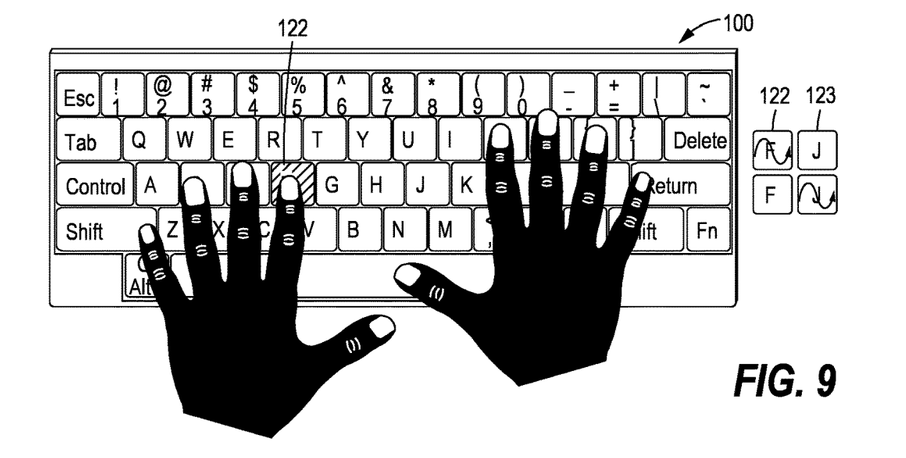
FIG. 9 illustrates an illustration of a user action corresponding to a step of the method shown in FIG. 6, and specifically where the keyboard is in a mouse cursor input mode.
Figure 10:
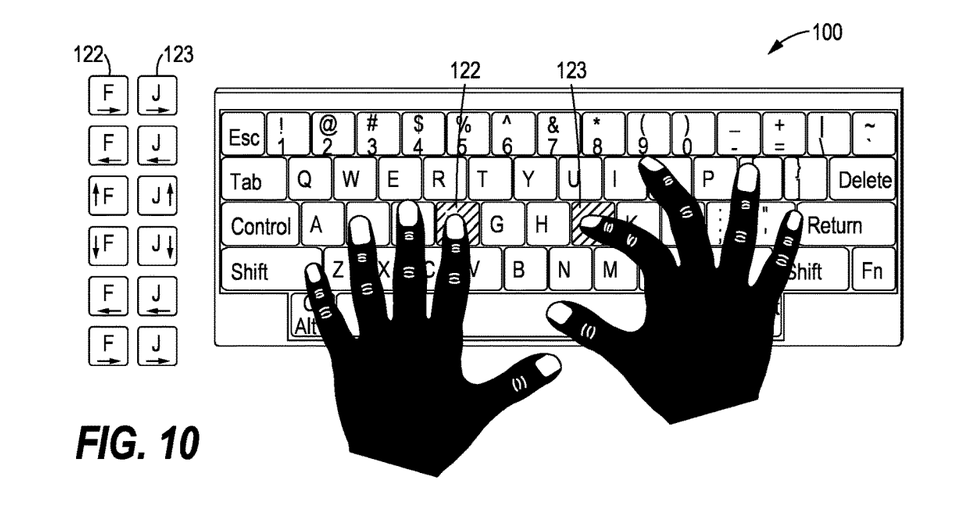
FIG. 10 illustrates an illustration of a user action corresponding to a step of the method shown in FIG. 6, and specifically where the keyboard is in a gesture input mode.

With reference to FIGS. 6, 9, and 10, if there is a trigger activation, the keyboard 100 may enter either a mouse cursor input mode for receiving a mouse cursor input (block 632) or a gesture input mode for receiving a gesture input (block 640), depending on additional criteria. In an embodiment, the keyboard 100 may detect for touches on one or more home keys 122, 123 (again, without an accompanying keystroke) within a predetermined period of time after the trigger activation (block 620). If at least one home touch is detected, the method then proceeds to block 630, further qualifying the total number of touches detected. If exactly one home touch is detected, the keyboard 100 enters a cursor input mode (block 632). Accordingly, as shown in FIG. 9, the user may navigate either of the home keys 122, 123 like a mouse or touchpad to interact with a cursor on the GUI of the host device 10. Alternatively, if both home keys 122, 123 are touched, the keyboard 100 enters a gesture mode (block 640). Accordingly, as shown in FIG. 10, the user may navigate both home keys 123, 123 like a touchpad, entering gestures to interact with the GUI of the host device 10. In an embodiment, the keyboard 100 may be preprogrammed with one or more of the gestures seen in FIG. 10, where each gesture may correspond to a horizontal scrolling, vertical scrolling, or scaling function on the GUI. However, it should be understood that the illustrated gestures are exemplary only, where no limitation is intended for the type and number of available gestures, nor how they are programmed. Following the completion of block 640, the keyboard 100 may return to block 610 and restart the method 600.

Figure 11:
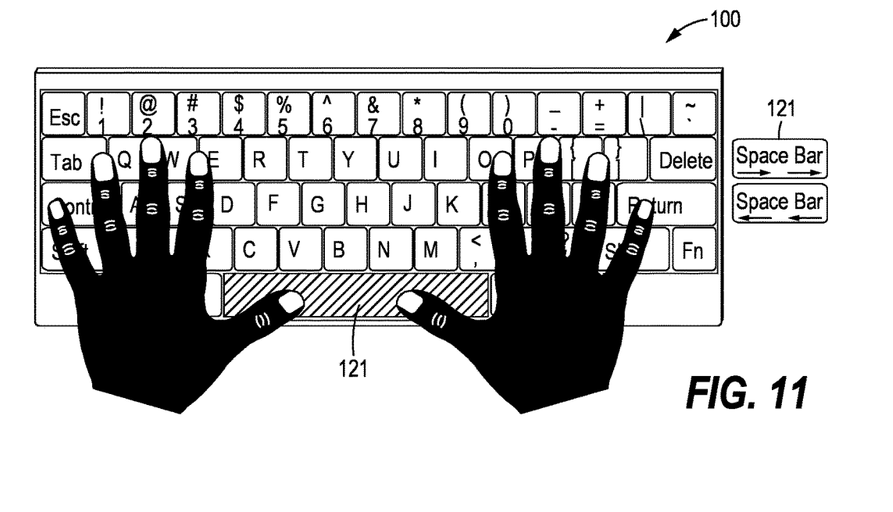
FIG. 11 illustrates an illustration of a user action corresponding to a step of the method shown in FIG. 6, and specifically where the keyboard is in a cursor-gesture input mode.
Figure 12A:
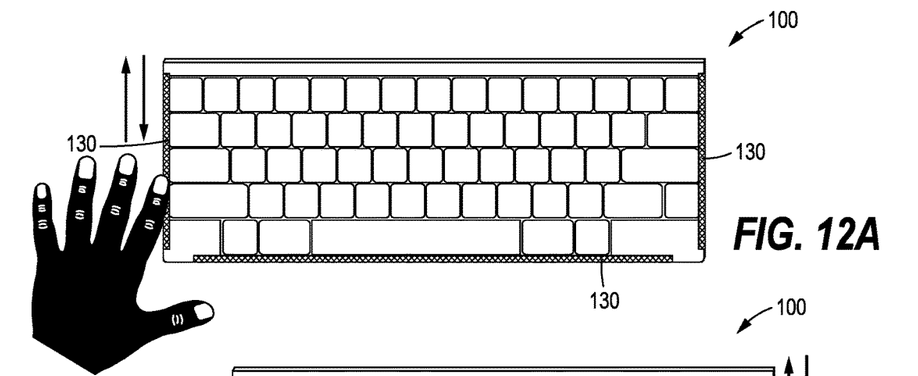
FIG. 12A illustrates an illustration of a user action corresponding to a method of operating a keyboard with navigational control functions according to an embodiment of the present disclosure.
Figures 12B, 12C, 12D:
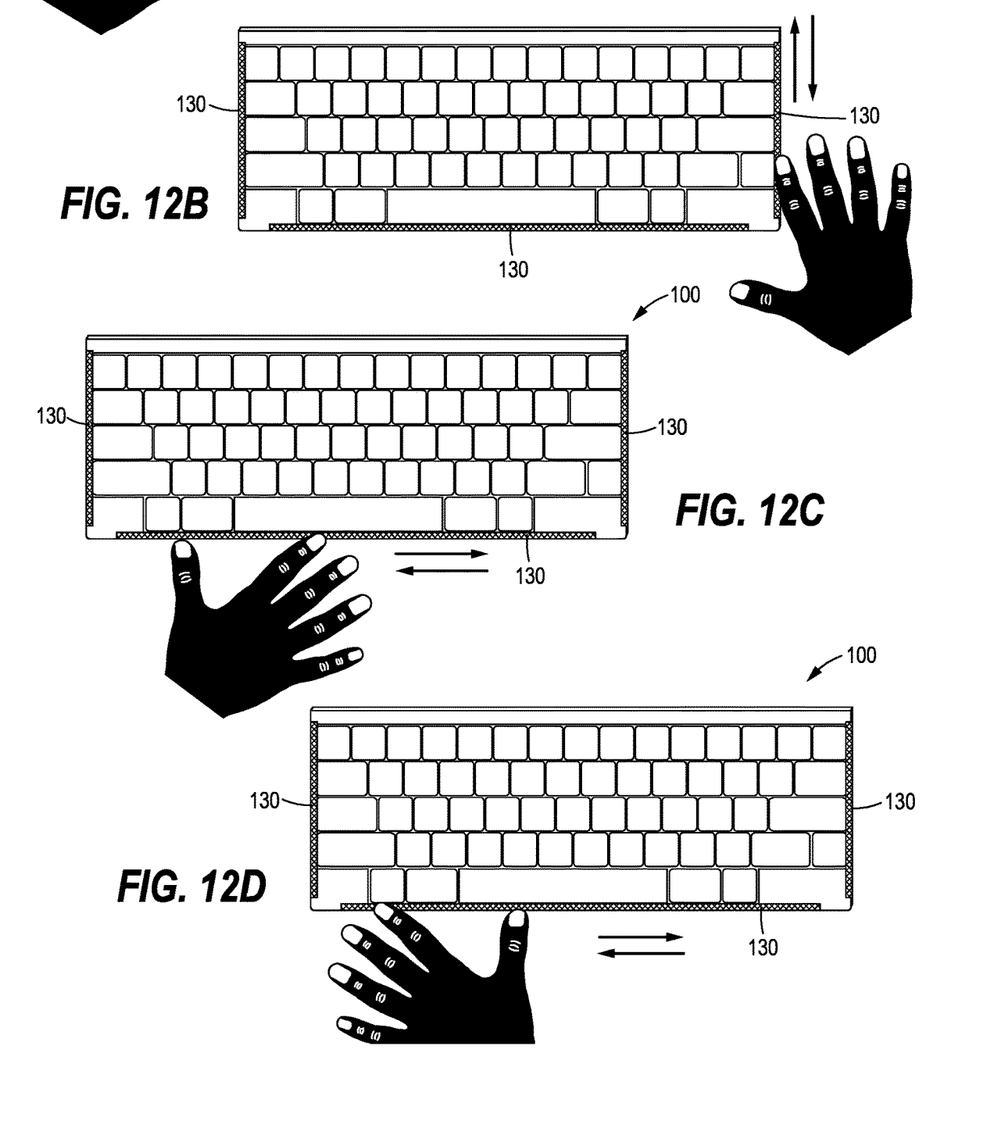
FIG. 12B illustrates an illustration of a user action corresponding to a method of operating a keyboard with navigational control functions according to an embodiment of the present disclosure.
FIG. 12C illustrates an illustration of a user action corresponding to a method of operating a keyboard with navigational control functions according to an embodiment of the present disclosure.
FIG. 12D illustrates an illustration of a user action corresponding to a method of operating a keyboard with navigational control functions, according to an embodiment of the present disclosure.

Returning now to FIG. 6, if neither home key 122, 123 is touched, the keyboard 100 may continue on to block 622. In block 622, if two points of contact are detected on the trigger key 121 (for example if the user touches the spacebar with both thumbs), the operating mode is a cursor-gesture input mode for receiving a cursor-gesture input (block 624). Accordingly, as shown in FIG. 11, the user may navigate the trigger key 121 with two contact points, entering cursor-gestures to interact with the GUI of the host device 10. In an embodiment, the keyboard 100 may be programmed with one or more of the cursor-gestures shown, where no limitation is intended for the type or number of gestures available, nor how they are programmed. If, however, two touches of the trigger key 121 are not detected, the keyboard 100 may continue to block 612 to transition into the text input mode. Following the completion of block 624, the keyboard 100 may return to block 610 and restart the method 600.

Finally, in some embodiments of the present disclosure, the edge touch sensors 130 of the keyboard 100 may be used at any point in time regardless of the operating mode. As seen in FIGS. 12A-12D, the user may navigate the edge touch sensors 130 located on various edges of the frame 101 in order to interact with the GUI of the host device 10. In an embodiment, the keyboard 100 may be programmed with one or more of the gestures depicted, where each gesture may correspond to a horizontal scrolling, vertical scrolling, scaling, or task switching function of the GUI. However, it should be understood that no limitation is intended for the type or number of available gestures, now how they are programmed. In some embodiments, the edge touch sensors 130 may be capable of receiving gesture inputs during any operating mode of the keyboard 100, or may only be available in specific operating modes following the completion of predetermined criteria.

All examples and conditional language recited in the present disclosure are intended for pedagogical objects to aid the reader in understanding the present disclosure and the concepts contributed by the inventor to furthering the art, and are to be construed as being without limitation to such specifically recited examples and conditions. Although embodiments of the present disclosure have been described in detail, various changes, substitutions, and alterations could be made hereto without departing from the spirit and scope of the present disclosure.

The invention claimed is:

1. A keyboard comprising:
   a frame;
   a plurality of keys supported by the frame, the plurality of keys include a designated trigger key and at least two designated home keys;
   a plurality of key-top touch sensors, each sensor located on a surface of each of the plurality of keys;
   one or more edge touch sensors, each sensor located on an edge of the frame; and
   a communication interface to output one or more navigational control signals received from the one or more key-top touch sensors or the one or more edge touch sensors;
   wherein the designated trigger key and the at least two designated home keys operate to provide a plurality of operating modes including a text input mode, a mouse cursor input mode, and a gesture input mode, such that,
      when a trigger activation is not detected from the trigger key, the keyboard enters into the text input mode to detect a keypress on one or more of the plurality of keys; and
      when the trigger activation is detected via a touch on the key-top sensor located on the surface of the trigger key, the keyboard enters into one of the mouse cursor input mode and the gesture input mode, selectable based on a detection, within a predetermined duration after the trigger activation is detected, of a number of home touches on the key-top touch sensor located on the surface of each of the designated home keys.

2. The keyboard according to claim 1, wherein the plurality of keys include capacitive keys and are configured to receive a text input.

3. The keyboard according to claim 1, wherein the one or more key-top touch sensors include a capacitive pad and are configured to receive a mouse cursor input and a gesture input.

4. The keyboard according to claim 3, wherein the home keys including an F-key and a J-key; and the trigger key includes a spacebar.

5. The keyboard according to claim 1, wherein the one or more edge touch sensors include a capacitive pad and are configured to receive a gesture input.

6. The keyboard according to claim 1, further comprising an embedded computer to receive and process instructions based on input from the keyboard.

7. The keyboard according to claim 1, further comprising:
a printed circuit board (PCB);
at least one electronic circuit installed on the PCB; and
an analog-to-digital converter (ADC) implemented on the at least one electronic circuit, wherein the ADC implements at least one of:
converting an analog keypress signal from the keypress on one of the plurality of keys into a digital keypress signal;
converting an analog key-top touch signal from the one or more the key-top touch sensors into a digital key-top touch signal; and
converting an analog edge touch signal from the one or more edge touch sensors into a digital edge touch signal.

8. The keyboard according to claim 7, wherein the at least one electronic circuit further implements a touch slider encoder which converts the digital edge touch signal from the ADC into a gesture input.

9. The keyboard according to claim 7, wherein the at least one electronic circuit further implements a signal converter which operatively receives the digital keypress signal and the digital key-top touch signal from the ADC and determines whether a text input, mouse cursor input, or gesture input is intended.

10. The keyboard according to claim 9, wherein the at least one electronic circuit further implements a keystroke detector which determines whether a digital keypress signal from the ADC registers as a keystroke.

11. The keyboard according to claim 9, wherein the at least one electronic circuit further implements a touchpad XY encoder which converts the digital key-top touch signal from the ADC into navigational information.

12. The keyboard according to claim 11, wherein the at least one electronic circuit further includes a mouse coordinate converter which operatively converts the navigational information from the touchpad XY encoder into a mouse cursor input.

13. A system for navigating a host device, comprising:
a host device, including:
a display serving as a graphical user interface (GUI); and
a host communication interface to receive one or more navigational control signals received from one or more key-top touch sensors and one or more edge touch sensors; and
a keyboard with navigational control functions, including:
a frame;
a plurality of keys supported by the frame, the plurality of keys include a designated trigger key and at least two designated home keys;
the one or more key-top touch sensors, each sensor located on a surface of each of the plurality of keys;
the one or more edge touch sensors, each sensor located on an edge of the frame; and
a keyboard communication interface to output the one or more navigational control signals received from the one or more key-top touch sensors or the one or more edge touch sensors;
wherein the designated trigger key and the at least two designated home keys operate to provide a plurality of operating modes including a text input mode, a mouse cursor input mode, and a gesture input mode, such that,
when a trigger activation is not detected from the trigger key, the keyboard enters into the text input mode to detect a keypress on one or more of the plurality of keys; and
when the trigger activation is detected via a touch on the key-top sensor located on the surface of the trigger key, the keyboard enters into one of the mouse cursor input mode and the gesture input mode, selectable based on a detection, within a predetermined duration after the trigger activation is detected, of a number of home touches on the key-top touch sensor located on the surface of each of the designated home keys.

14. The system according to claim 13, wherein the plurality of keys are configured to receive a text input; the one or more key-top touch sensors include a capacitive pad and are configured to receive a mouse cursor input and a gesture input; and the one or more edge touch sensors include a capacitive pad and are configured to receive a gesture input.

15. A method of operating a keyboard, comprising:
detecting a trigger activation from a touch on a key-top touch sensor located on a designated trigger key of a plurality of keys on the keyboard; and
entering an operating mode of the keyboard based on the trigger activation, such that:
when the trigger activation is not detected, the operating mode is a text input mode to detect a keypress on one more of the plurality of keys; and
when the trigger activation is detected, the operating mode is one of a mouse cursor input mode, a gesture input mode, and a cursor-gesture input mode selectable based on detecting, within a predetermined duration after the trigger activation is detected, a number of home touches on one or more key-top touch sensors located on two designated home keys of the plurality of keys.

16. The method according to claim 15, further comprising:
when the trigger activation is detected, entering an operating mode of the keyboard based on the number of home touches, such that:
when the number of home touches detected is one on one of the designated home keys, the operating mode is the mouse cursor input mode;
when the number of home touches detected is two on both of the designated home keys, the operating mode is the gesture mode; and
when the number of home touches detected is none, the operating mode is the cursor-gesture input mode.

17. The method according to claim 16, further comprising the following when the operating mode is the mouse cursor input mode:
receiving an analog key-top touch signal from the key-top touch sensor located on the home key; and
operatively converting the analog key-top touch signal into a mouse cursor input through exponential conversion or continuous output conversion.

18. The method according to claim 16, further comprising the following when the operating mode is the gesture input mode:
- receiving analog key-top touch signals from the key-top touch sensors located on the two home keys; and
- operatively converting the analog key-top touch signals into a gesture input;
- wherein the gesture input is a horizontal scroll, a vertical scroll, a scale up, a scale down, a pan, or a task switch.

19. The method according to claim 16, further comprising the following when the operating mode is the cursor-gesture input mode:
- receiving analog key-top touch signals from the key-top touch sensors located on the trigger key; and
- operatively converting the analog key-top touch signals into a cursor-gesture input;
- wherein the cursor-gesture input is a lateral cursor movement.

20. The method according to claim 15, further comprising the following during any of the operating mode:
- receiving an analog edge touch signal from an edge touch sensor; and
- operatively converting the analog edge touch signal into a gesture input;
- wherein the gesture input is a horizontal scroll, a vertical scroll, a scale up, a scale down, a pan, or a task switch.

* * * * *